US006785154B2

(12) United States Patent
Sunaga et al.

(10) Patent No.: US 6,785,154 B2
(45) Date of Patent: Aug. 31, 2004

(54) MRAM AND ACCESS METHOD THEREOF

(75) Inventors: Toshio Sunaga, Ohtsu (JP); Hisatada Miyatake, Ohtsu (JP); Koji Kitamura, Shiga-ken (JP); Hideo Asano, Machida (JP); Kohki Noda, Fujisawa (JP); Hiroshi Umezaki, Fujisawa (JP)

(73) Assignee: International Business Machines Corporation, Armonk, NY (US)

( * ) Notice: Subject to any disclaimer, the term of this patent is extended or adjusted under 35 U.S.C. 154(b) by 110 days.

(21) Appl. No.: 10/134,100

(22) Filed: Apr. 26, 2002

(65) Prior Publication Data
US 2002/0159286 A1 Oct. 31, 2002

(30) Foreign Application Priority Data

Apr. 27, 2001 (JP) ........................................ 2001-130496
Jun. 29, 2001 (JP) ........................................ 2001-199620

(51) Int. Cl.[7] ............................................. G11C 17/00
(52) U.S. Cl. ............... 365/100; 365/225.5; 365/230.06; 365/232; 365/46

(58) Field of Search ............................. 365/100, 225.5, 365/230.06, 232, 46

(56) References Cited

U.S. PATENT DOCUMENTS 5,825,682 A * 10/1998 Fukui .......................... 365/49
5,982,675 A * 11/1999 Fujimoto ................ 365/189.05
6,438,665 B2 * 8/2002 Norman ....................... 711/159

* cited by examiner

Primary Examiner—Connie C. Yoha
(74) Attorney, Agent, or Firm—Margaret A. Pepper

(57) ABSTRACT

A magnetic random access memory (MRAM) circuit block and access method thereof are disclosed herein which includes a circuit for sensing a data write current passing through a bitline 32 and, for generating a stop signal for stopping a data write current supply to the bitline 32 and a write wordline 30 after data is written in an magnetic tunnel junction (MTJ) element 44. Further, when data to be written to the storage element is the same as the data already stored therein, no write current is supplied to the write wordline 30, thereby saving power.

11 Claims, 4 Drawing Sheets

MRAM AND ACCESS METHOD THEREOF

FIELD OF THE INVENTION

The present invention relates to a memory circuit block and a method for accessing the memory circuit block that can reduce and optimize a write current provided onto a write wordline and a bitline.

BACKGROUND OF THE INVENTION

The following description is provided as background to the invention. Referring to FIG. 4, a memory array of a memory circuit block is organized as a matrix of a plurality of bitlines 32 and a plurality of wordlines (write wordlines 30 and read wordlines 28) and an MTJ (Magnetic Tunnel Junction) element, which is a memory cell element, is placed at each intersection. To write data in an MTJ element, an electric current is supplied to a write wordline 30 and a bitline 32 to produce a magnetic field on each of these lines. As shown in FIG. 3, the MTJ element 44 consists of at least three layers, i.e., a free layer 46, which is a ferromagnetic layer the magnetization direction of which can be changed, a tunneling barrier 48, which is an insulator layer conducting a tunnel current, and a pinned layer 50, which is a ferromagnetic layer having a fixed magnetization direction. The magnetization direction of the free layer is changed according to the combined magnetic field of the write wordline 30 and the bitline 32. The resistance of an equivalent resistance 52, when a current passes across the free layer 46 and the pinned layer 50 through the tunnel barrier 48 layer, varies depending on the magnetization direction of the free layer 46 with respect to the magnetization direction of the pinned layer 50. Data are distinguished (between "1" and "0") based on this resistance difference. For example, the resistance becomes low to indicate "0" when the magnetization directions are the same, and the resistance becomes high to indicate "1" when the magnetization directions are opposite to each other.

The memory circuit block 54 used in a conventional memory such as MRAM shown in FIG. 4 may perform an operation for writing the same data as that stored in an MTJ element into that MTJ element. That is, even though the data to be written is identical to that previously stored in the MTJ element, write currents still flow to the write wordline 30 and the bitline 32 to magnetize the free layer again in the same direction as already stored data. This operation is unnecessary at all and thus wasting power.

The memory circuit block 54 uses pulse currents as the write currents supplied onto the write wordline 30 and the bitline 32. The write current, which is the average of the pulse currents per cycle time, is about 10 times larger than a read current. In addition, the amount of pulse current required for reversing the magnetization direction of the free layer 46 of the MTJ element 44 varies widely. A write current for an MTJ element 44 must be higher than the largest write current among all the memory cells. Therefore, a very large write current is required for data write operations in total, resulting in large power consumption during write operations compared with read operations in the MRAM.

It is an object of the present invention to provide a memory circuit block and a method for accessing the memory circuit block that can reduce and optimize a write electric current supplied onto a write wordline and a bitline.

SUMMARY OF THE INVENTION

A memory circuit block of the present invention comprises a memory array in which a plurality of wordlines and a plurality of bitlines are provided in matrix form and a memory element is provided at intersections of the wordlines and the bitlines, the memory element including at least a ferromagnetic layer having a magnetization direction determined by the orientation of a magnetic field generated by an electric current passing through respective bitline; a read wordline driver for applying a read voltage to a wordline; a write wordline driver for providing a write current onto the wordline; a bitline driver for providing a write current onto a bitline; a sensing amplifier for sensing and amplifying data in a memory element; an input/output pad for inputting and outputting data; a module for sensing a data write current passing thorough the bitline; and a module for generating a stop signal for stopping the supply of the data write current to the bitline and the wordline after data is written in the memory element.

A method for accessing a memory circuit block constituted as described above, comprises sensing a current passing through a bitline for writing data in a memory element, and generating a signal for stopping the data write current provided onto the wordline and the bitline after a change in current is detected when sensing the current.

Preferably, according to the memory circuit block and access method of the present invention, currents consumed in the memory circuit block can be reduced by performing a data read operation while performing a data write operation at substantially the same operation speeds as those of prior-art memory circuit blocks. In addition, write currents can be reduced compared with prior-art memory circuit blocks and access methods by only writing to a memory element when the data to be stored is different from the data already stored in the memory element.

DETAILED DESCRIPTION OF THE PREFERRED EMBODIMENTS

Figure 1:
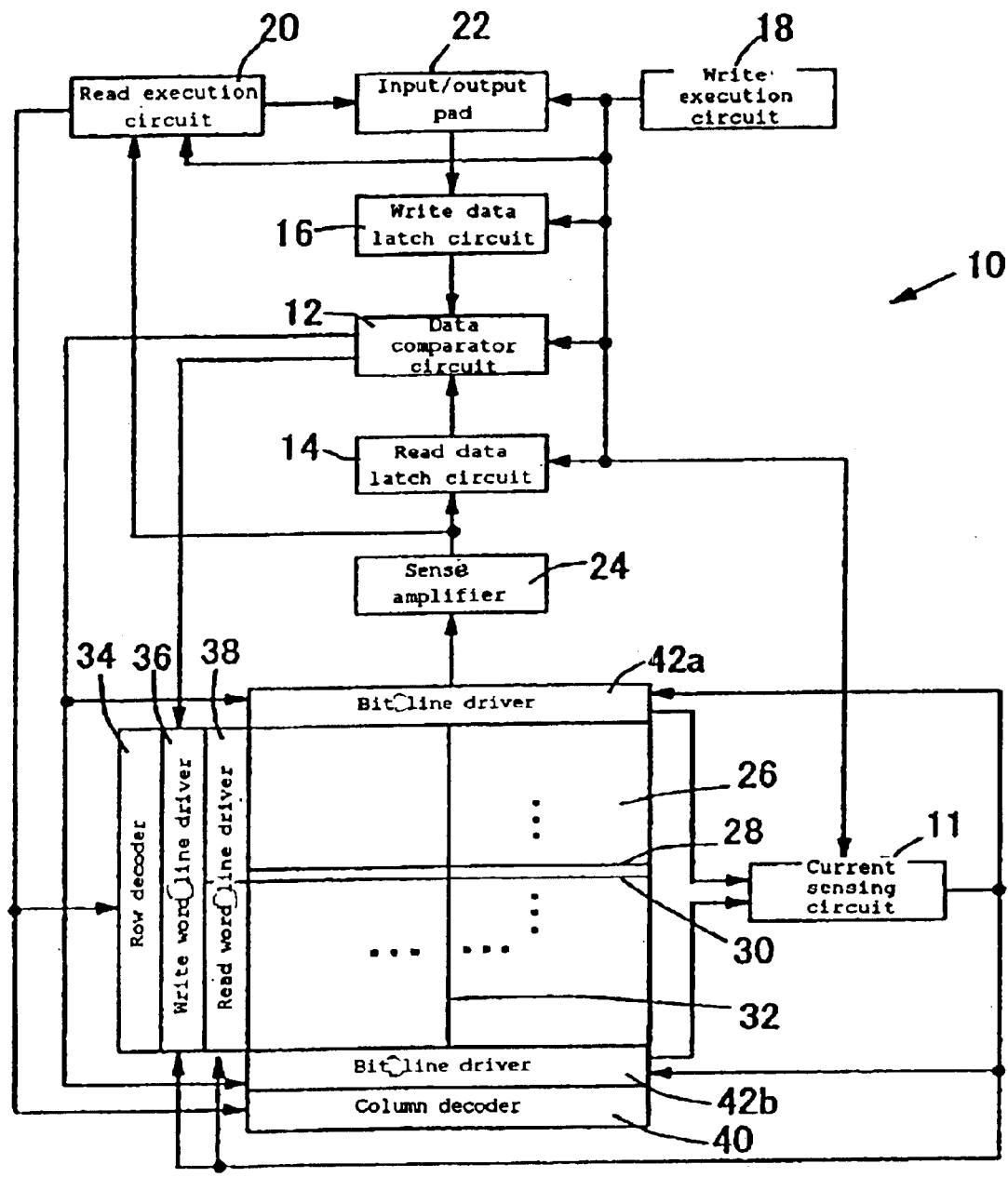
FIG. 1 shows a configuration of a memory circuit block according to the present invention.

A memory circuit block and access method according to the present invention will now be described below with respect to the accompanying drawings. As shown in FIG. 1, the memory circuit block 10 according to the present invention comprises a current sensing circuit 11 which senses a data write current passing through a bitline 32 and generates a stop signal that terminates data write signals passing through the bitline 32 and a write wordline 30 after data is written in a memory element. The stop signal is provided to a bitline driver 42a or 42b, and a write wordline driver 36 and read wordline driver 38.

The memory circuit block 10 also comprises a read data latch circuit 14 connected to a sense amplifier 24 for holding data, a write data latch circuit 16 connected to an input/output pad 22 for holding data, and a data comparator circuit 12 for comparing data held in the read data latch circuit 14 and the write data latch circuit 16. The read data latch circuit 14 and the write data latch circuit 16 may be constructed of CMOS (complementary Metal Oxide Semiconductor) devices, for example. The data comparator circuit 12 may be constructed of a logic circuit, for example.

The data comparator circuit 12 also includes means of transmitting the compared result to the bitline driver 42a or 42b and the write wordline driver 36. The bitline driver 42a or 42b and the write wordline driver 36 select a bitline 32 and a wordline 30, respectively, based on the result of the comparison and a write signal is sent to them to write data in a memory element.

In a memory array 26, the bitline 32 and the wordlines (write wordline 30 and read wordline 28) are arranged in matrix form and a memory element is placed at each intersection of them.

Figure 3:
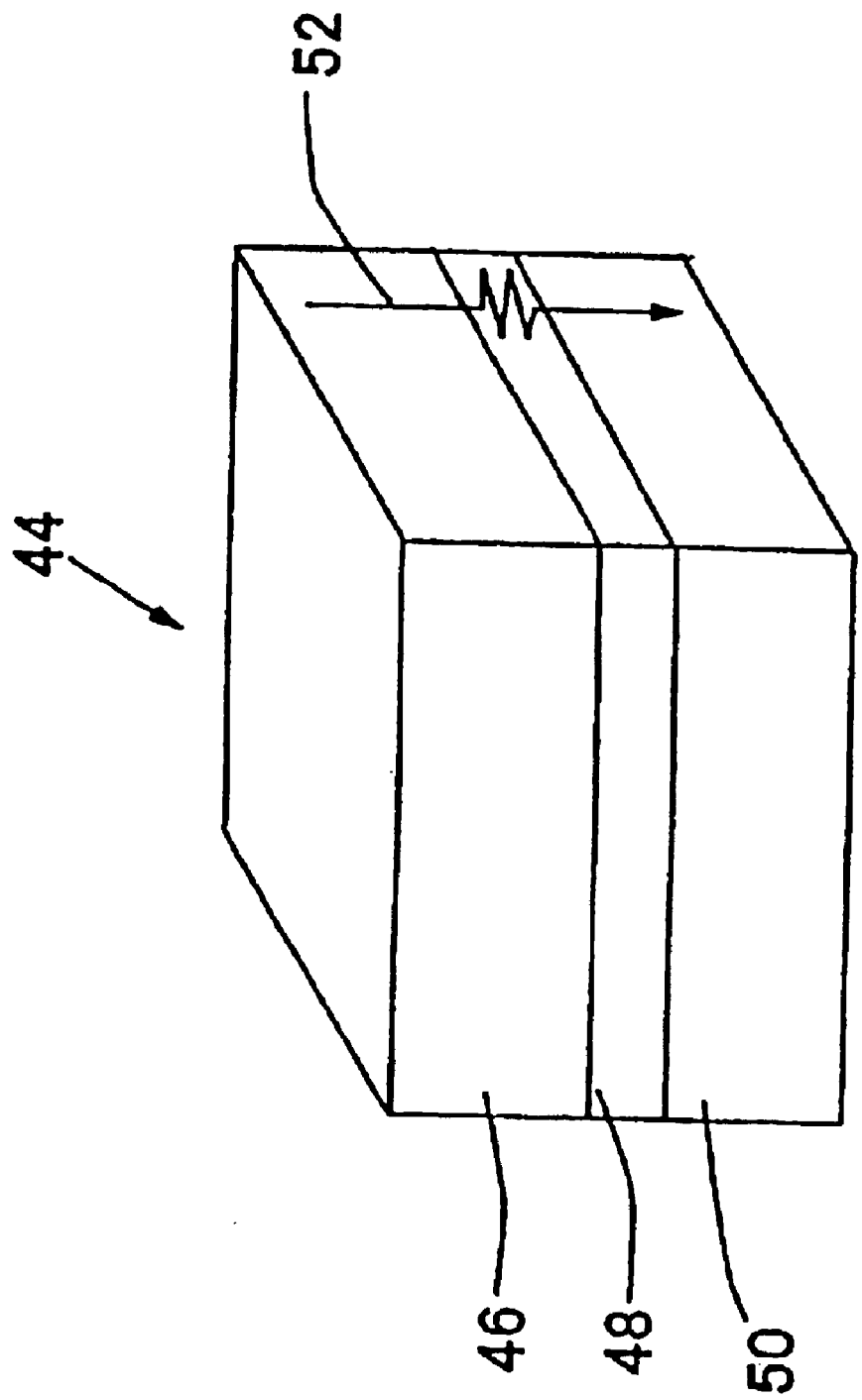
FIG. 3 shows a configuration of an MTJ element.
Figure 4:
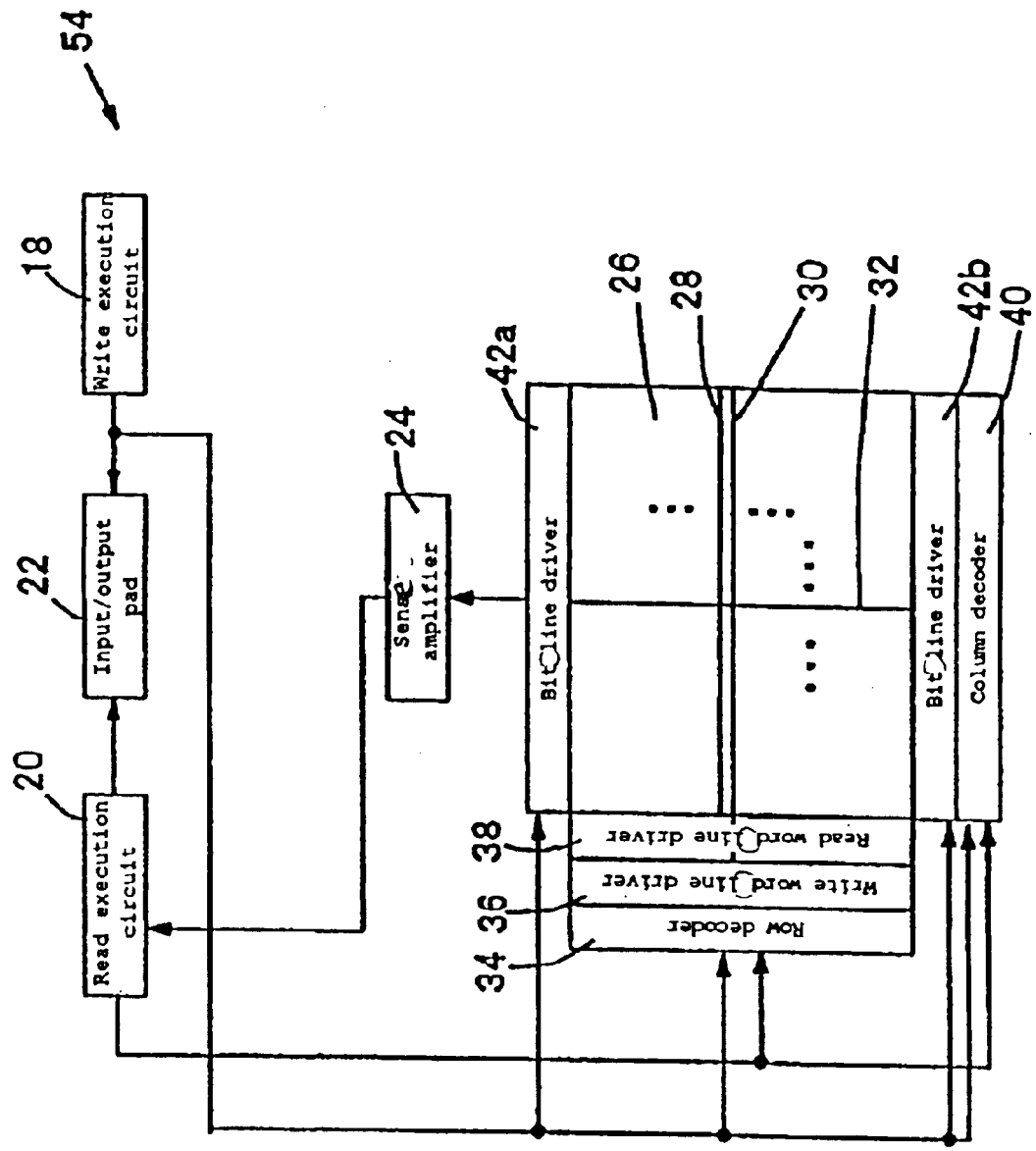
FIG. 4 shows a configuration of a memory circuit block including an MTJ element.

The MTJ element 44 shown in FIG. 3 is used as the memory element. The MTJ element 44 consists of at least three layers (a free layer 46 the magnetization direction of which can be changed, a tunneling barrier 48, which is an insulator layer conducting a tunnel current, and a pinned layer 50, which is a ferromagnetic layer the magnetization direction of which is fixed).

In the memory array 26, a write wordline driver 36, a read wordline driver 38, and a row decoder 34 for operating them are provided along row addresses (in the horizontal direction in FIG. 1) and bitline drivers 42a, 42b, and a column decoder 40 for operating them are provided along column addresses (in the vertical direction in FIG. 1). Although only one row decoder 34 is provided as mentioned above, the memory array 26 has two types of wordlines: read wordline 28 and write wordline 30. In operation, the write current passing through the write wordline 30 is a current increasing with time, for example as a linear ramp-up current.

The bitline drivers 42a, 42b are provided at opposite ends of the bitline 32. They are required for determining the magnetization direction of the free layer of the MTJ element. For example, when the upper bitline driver 42a in FIG. 1 is activated, a write current flows in the bitline 32 from top to bottom in FIG. 1. When the lower bitline driver 42b is activated, the write current flows in the opposite direction. The memory circuit block 10 also comprises a write execution circuit 18 and a read execution circuit 20.

A method for accessing the memory circuit block 10 will be described below. A data read method will be described first. During a data read, the read execution circuit 20 is activated. The activation of the read execution circuit 20 turns on the row decoder 34 and the column decoder 40. The row decoder 34 and the column decoder 40 receive a row address and a column address, respectively, from an external circuit. The row decoder 34 decodes the row address and sends it to the read wordline driver 38. The read wordline driver 38 applies a read voltage to a read wordline 28. The column decoder 40 decodes the column address and selects a bitline 32 corresponding to the decoded column address and connects it to the sense amplifier 24. The MTJ element 44 of a memory cell at the intersection of the activated read wordline 28 and the selected bitline 32 is selected. Data in the selected MTJ element 44 is sensed and amplified by the sense amplifier 24. The write execution circuit 18 is not activated during the data read operation. The data in the MTJ element 44 is transferred to the input/output pad 22 through the read execution circuit 20.

In a data write method, a read access is first performed in the same way as the data read described above. However, this particular read access activates the write execution circuit 18 and does not activate the read execution circuit 20. This causes read data, which is sensed and amplified by the sense amplifier 24, to be transferred to the read data latch circuit 14 and temporarily stored in it. During the write operation, a row address and column address are held in the row decoder 34 and the column decoder 40, respectively. While data held by an MTJ element 44 into which data is to be written is being read as described above, the input/output pad 22 receives the write data to be written into the MTJ element 44. The write data is held by the write data latch circuit 16. After the data read from the MTJ element 44 and the write data to be written into the MTJ element 44 are placed in the read data latch circuit 14 and the write data latch circuit 16, respectively, the data comparator 12 compares the data in these latches.

If the data are the same, the write operation ends without writing the data into the MTJ element 44. Thus, no write current is provided onto the write wordline 30 nor the bitline 32. By eliminating a write operation in this way when data to be written is identical to data stored, write currents, which are large in memory that uses MTJ element, can be statistically reduced and therefore power consumption during write operations can be reduced.

On the other hand, if the two data are different, the data comparator 12 transmits activation signals to the write wordline driver 36 and bitline driver 42a or 42b. One of the bitline drivers 42a and 42b is selected depending on the data to be written. The write wordline driver 36 uses the row address held in the row decoder 34 to select a write wordline 30 and provides a write current to it. The bitline 32 which has been selected during the data read is used.

The row address and column address specified during the read operation are used in the write operation as described above and the read operation and write operation are not separately performed by the memory circuit block 10 of the present invention. Therefore the row address and column address are specified once as in a conventional memory circuit block, without wasting power. Read operations are inherently faster than write operations. Therefore the read operation performed before the write operation will add only a few nanoseconds to time required for performing the write operation without the read operation. The time is hardly more than write operation cycle time in conventional memory circuit blocks and therefore does not have adverse effect.

Either the upper bitline driver 42a or the lower bitline driver 42b in FIG. 1 is activated based on whether data to be written in the MTJ device 44 is "1" or "0". Because the read wordline driver 38 is kept active and the gate of the transistor (MOSFET) for reading data from a memory cell is in the ON state, the write current is added to the read current for reading the bitline 32.

Here, it is assumed that the write current to be provided onto bitlines has a constant value. It is also assumed that the write current is to be provided onto the write wordline. This increases a combined magnetic field produced by the two write currents with time until it eventually reaches a value sufficient to reverse the magnetization direction of the free layer 46 of the MTJ element 44.

The write current passing through the write wordline 30 increases gradually and the intensity of the combined magnetic field increases accordingly. When the combined magnetic field generated by the two write currents passing through the wordline 30 and bitline 32 reaches a value sufficient to change the magnetization direction of the free layer 46, the magnetization direction of the free layer 46 is inverted, the value of the resistance 52 of the MTJ element 44 changes, and the write current on the bitline 32 also changes. Because this change means the completion of the data write operation, the current sense circuit 11 generates and sends a stop signal for inactivating the read wordline driver 38, the write wordline driver 36, and bitline driver 42a or 42b. Then the data write operation ends.

Because a current, for example a linear ramp-up current, which increases with time, is used to write data and, after the completion of the data write, the current supply is stopped, no excess current is consumed. That is, no excess current is provided onto the write wordline 30.

Figure 2:
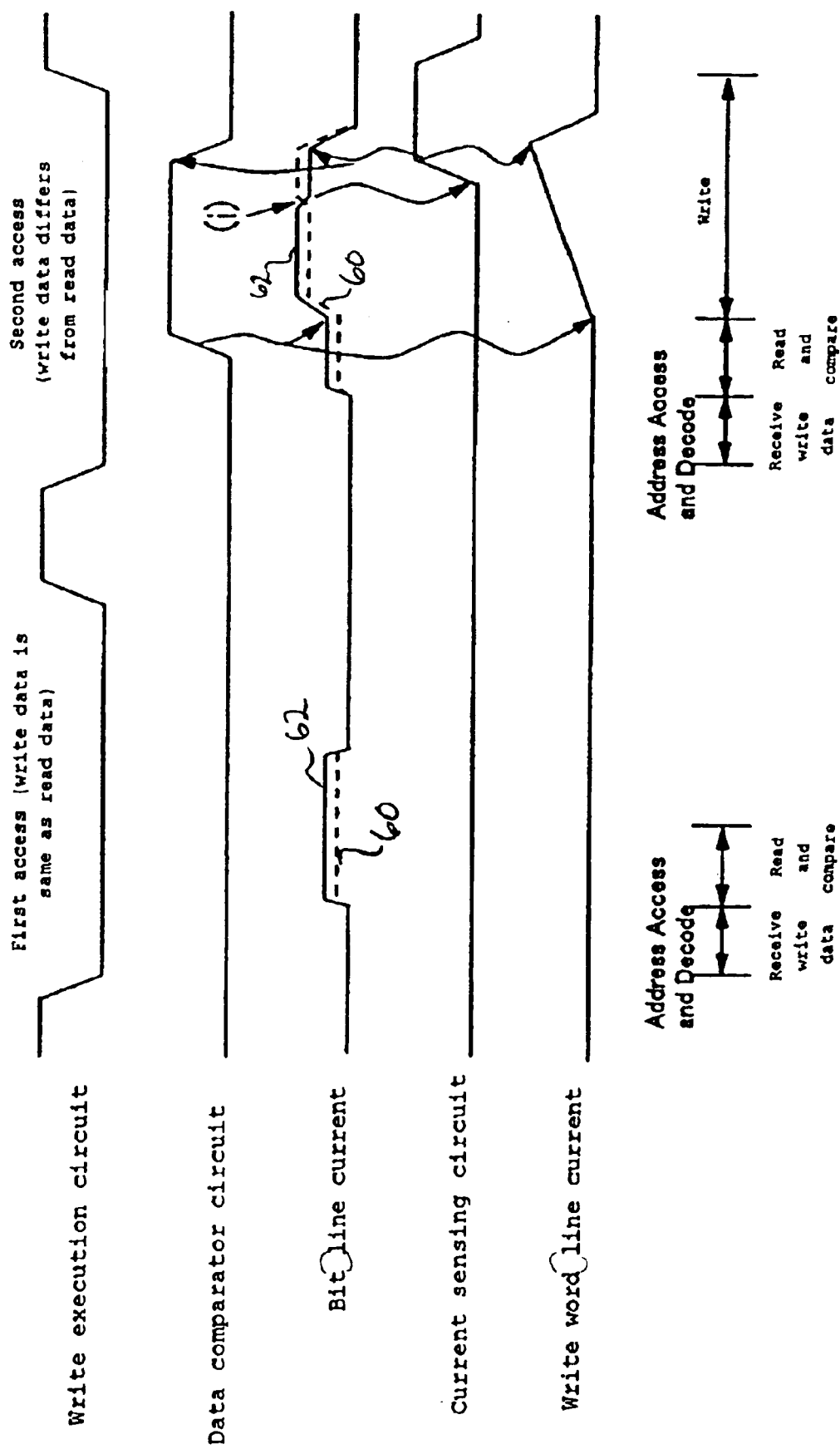
FIG. 2 shows a timing chart of the memory circuit block according to the present invention.

The two accesses mentioned above will be described below with respect to FIG. 2. In the first access, the write data is identical to the read data. After a row address is specified, a read voltage is applied to a read wordline 28 associated with the row address to activate it. The resistance of the MTJ element 44 varies depending on the magnetization direction of the free layer 46 with respect to the magnetization direction of the pinned layer 50. For example, the resistance is high when the magnetization directions are different (the data is "1") compared with the resistance when they are the same (the data is "0"). A dashed line 60 in FIG. 2 represents a waveform of a current when the resistance of the MTJ element 44 is high (the data is "1"). On the other hand, a solid line 62 represents the waveform of the current when the resistance of the MTJ element 44 is low (the data is "0"). Because the read data is identical to the write data, the data comparator circuit 12 is held low and the write operation ends without any current is actually provided.

In the second access, in which the write data differs from the read data, the data comparator circuit 12 reads the data from the MTJ element 44 and performs data comparison, then goes high, thereby linearly increasing the write current passing through the write wordline 30. The high signal indicates that the data compared in the data comparator circuit 12 are different. In addition to a read current, a write current passes through the bitline 32.

The addition of the write current results in a large current passing through the bitline 32. While the intensity of a magnetic field generated by the current passing through the bitline 32 is constant, the current passing through the write wordline 30 increases linearly and therefore the intensity of the combined magnetic field also increases gradually. After the combined magnetic field becomes sufficient to change the magnetization direction of the free layer 46 and the magnetization direction is changed, the resistance of the MTJ element 44 changes. For example, when the resistance changes from high to low, that is, the data changes from "1" to "0", the current on the bitline 32 is changed as indicated by the dashed line, then increases at a point indicated by (i) in FIG. 2. On the other hand, when the resistance of the MTJ element 44 rises from low to high, the current on the bitline 32 changes as indicated by the solid line and decreases at (i) in FIG. 2.

A change in the current passing through the bitline 32 indicates a change in the resistance of the MTJ element 44, that is, a change in data written into the MTJ element 44. Therefore the change in the current passing through the bitline 32 means the completion of the write operation. Thus, the current sense circuit 11 detects this change and the signal generated by the current sense circuit 11 changes from low to high. That is, a stop signal is generated. The stop signal is sent to the read world line driver 38, write wordline driver 36, and bitline driver 42a or 42b to turn off the write signal to the bitline 32 or the write wordline 30.

As shown in FIG. 2, when the magnetization direction of the free layer 46 of the MTJ element 44 changes, the write current supply is stopped. Therefore no excess current flows and power consumption is reduced. In addition, the fact that all the current supply is stopped when the magnetization direction changes means that an optimum current required for changing the magnetization direction of the free layer 46 is consumed.

As described above, the memory circuit block 10 according to the present invention supplies no current if data to be written and data to be read are the same. Therefore, a high probability that the same data as that stored in an MTJ element 44 is written into the MTJ element 44 statistically enables power savings. In addition, total power consumption during data writes can be reduced by controlling a write current for each MTJ element 44. This is a significant advantage over conventional memory circuit blocks, which constantly operate at maximum currents. Moreover, because the total power consumption is reduced, temperature rise can be minimized and the data writes or reads by malfunctions of the memory circuit block 10 will be decreased. That is, stable operation of the memory circuit block 10 can be achieved.

Although a linear ramp-up current is used in the write wordline 30 in the above-described embodiment, it can be used in the bitline 32 with a constant current in the write wordline 30. That is, the write currents provided to the bitline 32 and the write wordline 30 may be replaced with each other. Alternatively, the triangular wave write current may be provided to both of the write wordline 30 and the bitline 32. Of course, the currents are not limited to triangular wave currents and any other currents that increase with time may be used.

The above-described process can be applied to multi-bit data. The data comparator circuit 12 may compare multiple pieces of data and send the result of the comparison to the write wordline driver 36 and bitline drivers 42a, 42b to activate a wordline 30 and bitline 32 to be used for writing data.

While the memory circuit block and access method according to the present invention have been described, the present invention is not limited to them. For example, the present invention can be applied to a memory circuit block that uses a GMR (giant magnetoresistive) element in place of the MTJ element.

Instead of providing a read wordline and a write wordline separately, a wordline for common use be provided. This common wordline may be used as a read wordline to which a read voltage applied by a read wordline driver during a read operation and as a write wordline to which a write current is provided by a wordline driver during a write operation. The memory circuit block according to the present invention can be used in a logic chip containing one or more MRAM memory circuit blocks.

The present invention can be implemented in other forms and various improvements, modifications, and variations may be made to the present invention, which are apparent to those skilled in the art, without departing from the spirit of the present invention.

List of Symbols Used:

10 . . . Memory circuit block
11 . . . Current sense circuit
12 . . . Data comparator circuit
14 . . . Read data latch circuit
16 . . . Write data latch circuit
18 . . . Write execution circuit
20 . . . Read execution circuit
22 . . . Input/output pad
24 . . . Sense amplifier
26 . . . Memory array 28 . . . Read wordline
30 . . . Write wordline
32 . . . Bitline
34 . . . Row decoder
36 . . . Write wordline driver
38 . . . Read wordline driver
40 . . . Column decoder 42a, 42b . . . Bitline driver
44 . . . MTJ element
46 . . . Free layer
48 . . . Tunneling barrier
50 . . . Pinned layer
52 . . . Resistance of MTJ element
60 . . . Bitline current when MTJ element stores a high state
62 . . . Bitline current when MTJ element is low

What is claimed is:

1. A magnetic random access memory circuit block, comprising:

a memory array in which a plurality of wordlines and a plurality of bitlines are provided in matrix form and a memory element is provided at intersections of the wordlines and the bitlines, said memory elements including at least a ferromagnetic layer having a magnetization direction determined by the orientation of a magnetic field generated by an electric current passing through a respective bitline coupled thereto;

a read wordline driver for applying a read voltage to a wordline;

a write wordline driver for providing a write current onto said wordline;

a bitline driver for providing a write current onto a bitline;

a sense amplifier for sensing and amplifying data in a memory element;

an input/output pad for inputting and outputting data;

a module for sensing a data write current passing through said bitline; and a module for generating a stop signal for stopping the supply of the data write current to said bitline and said wordline after data is written in said memory element.

2. The memory circuit block according to claim 1, further comprising:

a module for holding date in said sense amplifier;

a module for holding data inputted to said input/output pad; and a module for comparing the data held by said module for holding data in said sense amplifier and said module for holding data inputted to said input/output pad.

3. The memory circuit block according to claim 1, wherein said write current provided onto said wordline is a current which increases with time.

4. The memory circuit block according to claim 3, wherein said current increasing with time is a triangular-wave current.

5. The memory circuit block according to claim 1, wherein said memory element comprises a magnetic tunnel junction element.

6. The memory circuit block according to claim 1, wherein said wordlines include write wordlines and read wordlines.

7. Within a magnetic random access memory circuit block comprising:

a memory array in which a plurality of wordlines and a plurality of bitlines are provided in matrix form and a memory element is provided at intersections of the worduines and the bitlines, said memory elements including at least a ferromagnetic layer having a magnetization direction determined by the orientation of a magnetic field generated by an electric current passing through a respective bitline coupled to said memory element;

a read wordline driver for applying a read voltage to a wordline;

a write wordline driver for providing a write current onto said wordline;

a bitline driver for providing a write current onto a bitline;

a sense amplifier for sensing sense and amplifying data in a memory element;

an input/ouput pad for inputting and outputting data;

a module for sensing a data write current passing through said bitline; and a module for generating a stop signal for stopping the supply of the data write current to said bitline and said word line after data is written in said memory element, a data access method comprising the steps of:

sensing current passing through said bitline for writing data in said memory element; and generating a stop signal for stopping the data write current provided onto said wordline and said bitline after a change in said current is detected at the step of sensing said current.

8. The access method according to claim 7, further comprising:

receiving said stop signal by said wordline driver and said bitline driver; and stopping currents supplied to said write wordline and said bitline by said wordline driver and said bitline driver.

9. The access method according to claim 7, further comprising comparing data already stored in said memory element with data to be stored in said memory element.

10. The access method according to claim 9, wherein said comparing data comprises only storing, in said memory element, data to be stored in said memory element if the data already stored in said memory element differs from the data to be stored in said memory element.

11. The access method according to claim 9, wherein said comparing data includes maintaining the data already stored in said memory element if the data stored in said memory element is identical to the data to be stored in said memory element.

* * * * *